(12) United States Patent
Chang et al.

(10) Patent No.: US 11,744,010 B2
(45) Date of Patent: Aug. 29, 2023

(54) SENSOR LENS ASSEMBLY HAVING NON-REFLOW CONFIGURATION

(71) Applicant: KINGPAK TECHNOLOGY INC., Hsin-Chu County (TW)

(72) Inventors: Chia-Shuai Chang, Hsin-Chu County (TW); Chien-Chen Lee, Hsin-Chu County (TW); Ya-Han Chang, Hsin-Chu County (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 20 days.

(21) Appl. No.: 17/573,588

(22) Filed: Jan. 11, 2022

(65) Prior Publication Data

US 2022/0361321 A1 Nov. 10, 2022

Related U.S. Application Data

(60) Provisional application No. 63/184,622, filed on May 5, 2021.

(30) Foreign Application Priority Data

Oct. 18, 2021 (TW) .................. 110138471

(51) Int. Cl.
| | |
|---|---|
| *H05K 1/02* | (2006.01) |
| *G02B 7/02* | (2021.01) |
| *G02B 7/00* | (2021.01) |
| *H05K 1/11* | (2006.01) |
| *H05K 1/18* | (2006.01) |

(52) U.S. Cl.
CPC ........... *H05K 1/0274* (2013.01); *G02B 7/006* (2013.01); *G02B 7/02* (2013.01); *H05K 1/111* (2013.01); *H05K 1/181* (2013.01); *H05K 2201/10121* (2013.01); *H05K 2201/10151* (2013.01)

(58) Field of Classification Search
CPC ...................................... H05K 1/0274
USPC .......................................... 361/767
See application file for complete search history.

(56) References Cited

U.S. PATENT DOCUMENTS

| | | | | |
|---|---|---|---|---|
| 2009/0128681 | A1* | 5/2009 | Kim ........ | H04N 23/57 348/335 |
| 2012/0268644 | A9* | 10/2012 | Lin .......... | G02B 7/02 348/340 |
| 2022/0360692 | A1* | 11/2022 | Chang ..... | H04N 23/51 |
| 2022/0361327 | A1* | 11/2022 | Chang ..... | H05K 1/111 |
| 2022/0394845 | A1* | 12/2022 | Chang ..... | H01L 24/48 |

* cited by examiner

*Primary Examiner* — Stanley Tso
(74) *Attorney, Agent, or Firm* — Li & Cai Intellectual Property Office

(57) ABSTRACT

A sensor lens assembly having a non-reflow configuration is provided. The sensor lens assembly includes a circuit board, an optical module fixed to a surface of the circuit board, a sensor chip assembled to the surface of the circuit board, a plurality of wires electrically coupling the sensor chip and the circuit board, a supporting adhesive layer, a light-permeable sheet, and a top shielding layer. The circuit board has no slot recessed in the surface thereof. The supporting adhesive layer is in a ringed shape and is disposed on a top surface of the sensor chip. The light-permeable sheet is disposed on the supporting adhesive layer and faces the sensor chip. The top shielding layer is formed on an outer surface of the light-permeable sheet and has an opening that is located above a sensing region of the sensor chip.

10 Claims, 9 Drawing Sheets

SENSOR LENS ASSEMBLY HAVING NON-REFLOW CONFIGURATION

CROSS-REFERENCE TO RELATED PATENT APPLICATION

This application claims the benefit of priority to Taiwan Patent Application No. 110138471, filed on Oct. 18, 2021. The entire content of the above identified application is incorporated herein by reference.

This application claims priority to the U.S. Provisional Patent Application Ser. No. 63/184,622 filed on May 5, 2021, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a sensor lens assembly, and more particularly to a sensor lens assembly having a non-reflow configuration.

BACKGROUND OF THE DISCLOSURE

A conventional sensor lens assembly is manufactured by fixing a sensor package structure onto a circuit board during a reflow process and then assembling an optical module to the circuit board. However, structural configuration of the conventional sensor lens assembly is limited by the sensor package structure, so that the structural configuration of the conventional sensor lens assembly is difficult to be improved. For example, since the sensor package structure of the conventional sensor lens assembly needs to undergo the reflow process for being fixed onto the circuit board, the connection between any two components of the sensor package structure must be capable of resisting high temperature.

SUMMARY OF THE DISCLOSURE

In response to the above-referenced technical inadequacy, the present disclosure provides a sensor lens assembly having a non-reflow configuration to effectively improve on the issues associated with conventional sensor lens assemblies.

In one aspect, the present disclosure provides a sensor lens assembly having a non-reflow configuration, which includes a circuit board, an optical module, a sensor chip, a plurality of wires, a supporting adhesive layer, a light-permeable sheet, a top shielding layer, and a lateral shielding layer. The circuit board has a first surface and a second surface that is opposite to the first surface. The circuit board has no slot recessed in the first surface, and the first surface of the circuit board includes a chip-bonding region and a plurality of bonding pads that are arranged outside of the chip-bonding region. The optical module includes a frame, at least one lens, and a filtering sheet. The frame is fixed on the first surface of the circuit board. The at least one lens is assembled into the frame, and a central axis of the at least one lens passes through the chip-bonding region. The filtering sheet is assembled into the frame and is positioned along the central axis. The frame, the filtering sheet, and the first surface jointly define a distribution space, and the chip-bonding region and the bonding pads are arranged in the distribution space. The sensor chip includes a sensing region arranged on a top surface thereof and a plurality of connection pads that are arranged on the top surface and outside of the sensing region. The sensor chip is disposed on the chip-bonding region, and the sensing region is located at the central axis. The bonding pads are respectively and electrically coupled to the connection pads through the wires. The supporting adhesive layer is in a ringed shape, and the supporting adhesive layer is disposed on the top surface of the sensor chip and outside of the sensing region. The light-permeable sheet has an inner surface, an outer surface, and a surrounding lateral surface that is connected to the inner surface and the outer surface. The inner surface of the light-permeable sheet is disposed on the supporting adhesive layer and faces the sensor chip, so that the light-permeable sheet, the supporting adhesive layer, and the top surface of the sensor chip jointly define an enclosed space. The top shielding layer is formed on the outer surface of the light-permeable sheet. The top shielding layer is in a ringed shape and has an opening arranged above the sensing region. The lateral shielding layer is formed on and occupies at least 30% of an area of the surrounding lateral surface of the light-permeable sheet.

In another aspect, the present disclosure provides a sensor lens assembly having a non-reflow configuration, which includes a circuit board, an optical module, a sensor chip, a plurality of wires, a supporting adhesive layer, a light-permeable sheet, a top shielding layer, and a sealing compound. The circuit board has a first surface and a second surface that is opposite to the first surface. The circuit board has no slot recessed in the first surface, and the first surface of the circuit board includes a chip-bonding region and a plurality of bonding pads that are arranged outside of the chip-bonding region. The optical module includes a frame, at least one lens, and a filtering sheet. The frame is fixed on the first surface of the circuit board. The at least one lens is assembled into the frame, and a central axis of the at least one lens passes through the chip-bonding region. The filtering sheet is assembled into the frame and is positioned along the central axis. The frame, the filtering sheet, and the first surface jointly define a distribution space, and the chip-bonding region and the bonding pads are arranged in the distribution space. The sensor chip includes a sensing region arranged on a top surface thereof and a plurality of connection pads that are arranged on the top surface and outside of the sensing region. The sensor chip is disposed on the chip-bonding region, and the sensing region is located at the central axis. The bonding pads are respectively and electrically coupled to the connection pads through the wires. The supporting adhesive layer is in a ringed shape, and the supporting adhesive layer is disposed on the top surface of the sensor chip and outside of the sensing region. The light-permeable sheet has an inner surface, an outer surface, and a surrounding lateral surface that is connected to the inner surface and the outer surface. The inner surface of the light-permeable sheet is disposed on the supporting adhesive layer and faces the sensor chip, so that the light-permeable sheet, the supporting adhesive layer, and the top surface of the sensor chip jointly define an enclosed space. The top shielding layer is formed on the outer surface of the light-permeable sheet. The top shielding layer is in a ringed shape and has an opening arranged above the sensing region. The sealing compound is opaque and is formed on the first surface of the circuit board. The sealing compound surrounds the sensor chip, the supporting adhesive layer, and the surrounding lateral surface of the light-permeable sheet, and the connection pads and at least part of each of the wires are embedded in the sealing compound.

Therefore, through cooperation of the above components, the sensor lens assembly provided by the present disclosure does not need to go through any reflow process through the non-reflow configuration thereof, such as to allow that the component relationships arranged in the distribution space (e.g., connection between any two of the sensor chip, the wires, the supporting adhesive layer, the light-permeable sheet, and the sealing compound) just need to satisfy a lower level of high-temperature resistance requirement. Accordingly, a material cost of the sensor lens assembly can be decreased, and the product yield of the sensor lens assembly can be increased.

Specifically, since the sensor lens assembly of the present disclosure does not need to go through a reflow process, the sensor lens assembly does not need to be subjected to relevant testing processes, thereby effectively simplifying the entire production process to improve the production efficiency of the sensor lens assembly.

In addition, the sensor lens assembly of the present disclosure is provided with the top shielding layer that is in cooperation with the lateral shielding layer or the opaque sealing compound, so as to make it difficult for external light to pass through the surrounding lateral surface of the light-permeable sheet, thereby effectively preventing the flare phenomenon from occurring to the sensor chip.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
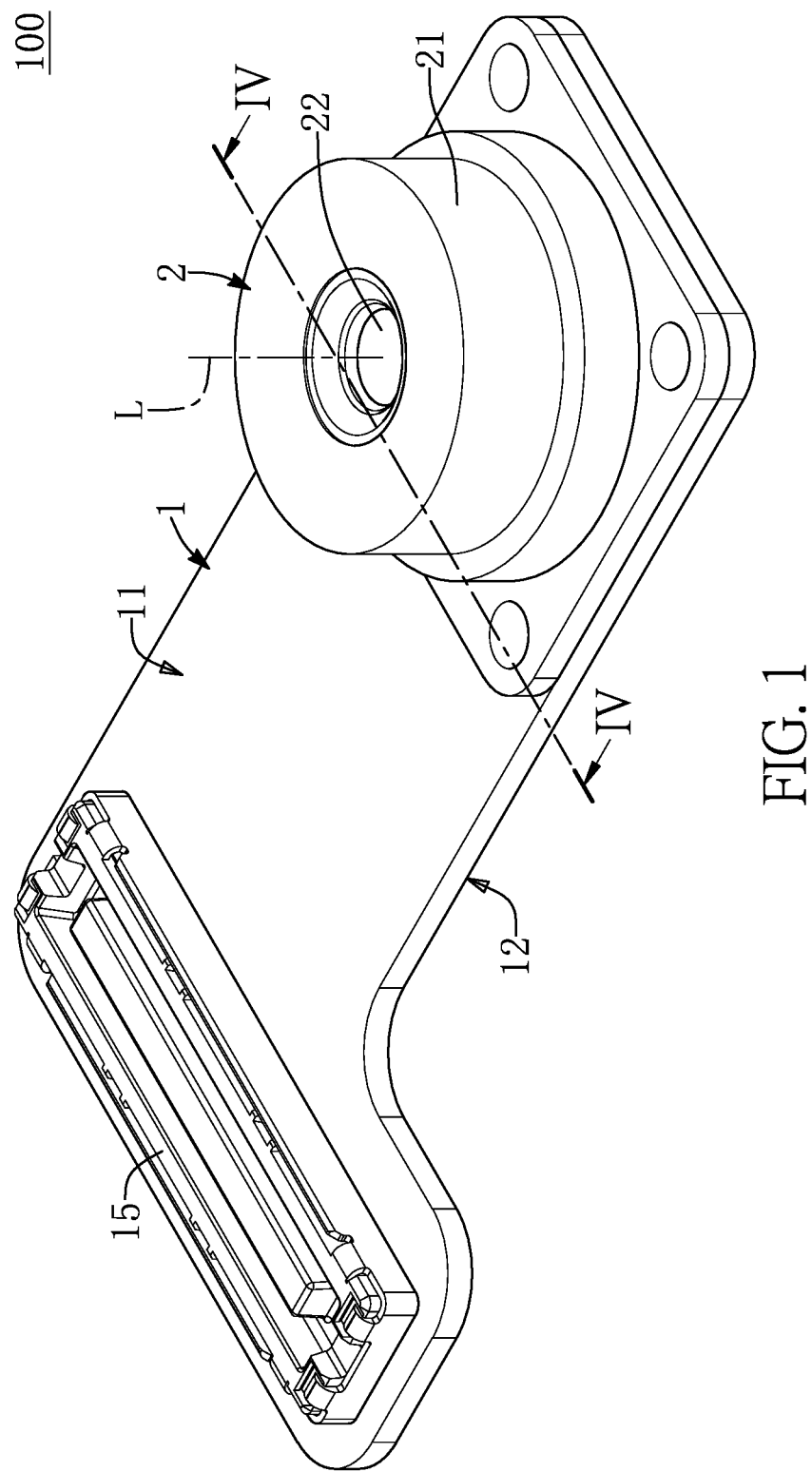
FIG. 1 is a perspective view of a sensor lens assembly having a non-reflow configuration according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
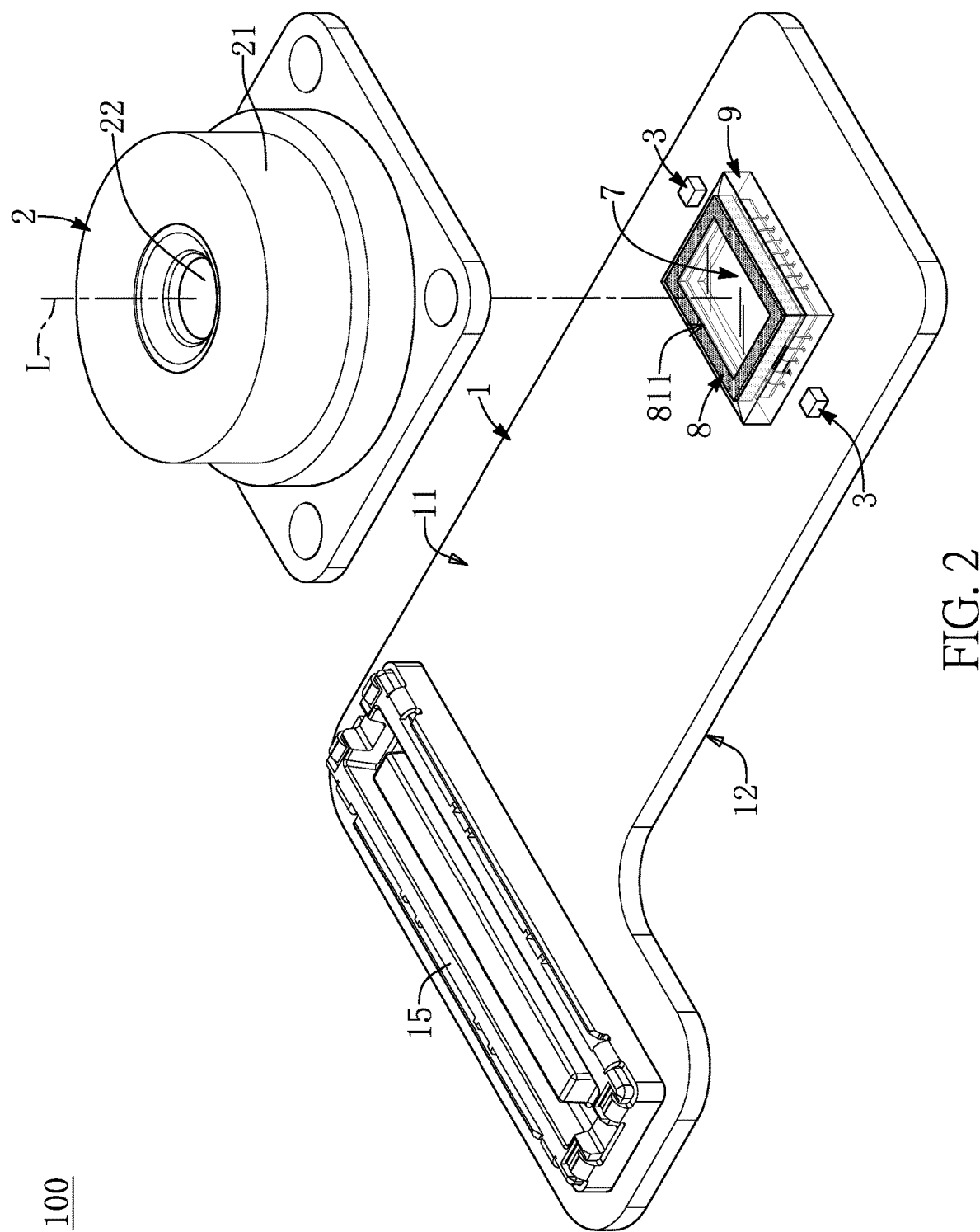
FIG. 2 is an exploded view of FIG. 1.

Referring to FIG. 1 to FIG. 7, a first embodiment of the present disclosure provides a sensor lens assembly 100 having a non-reflow configuration. As shown in FIG. 1 and FIG. 2, the sensor lens assembly 100 of the present embodiment does not have any package structure therein. In other words, any sensor lens assembly, which has a package structure or is formed by implementing a reflow process, is different from the sensor lens assembly 100 of the present embodiment.

Figure 3:
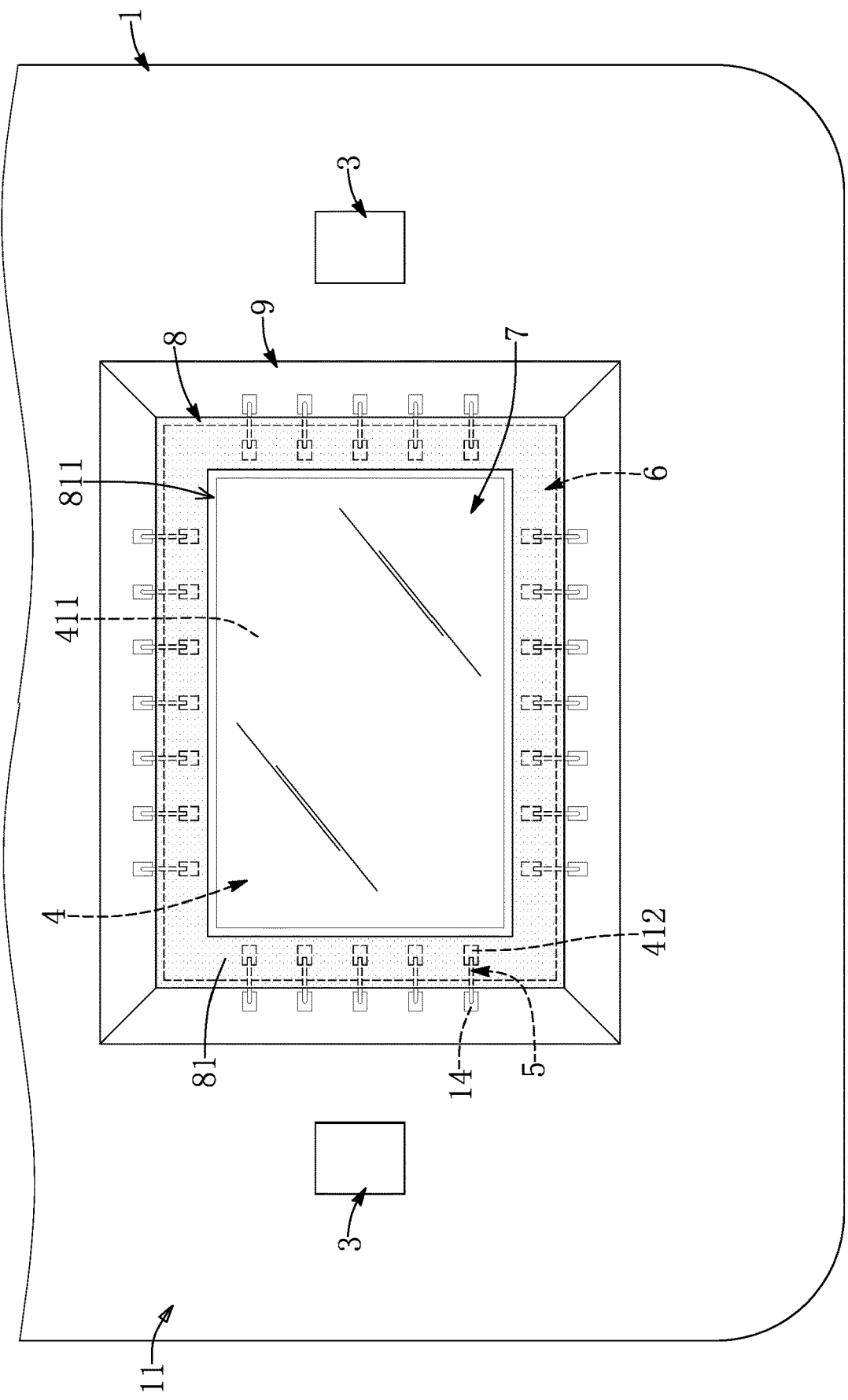
FIG. 3 is a partial top view of FIG. 2 when an optical module is omitted.
Figure 4:
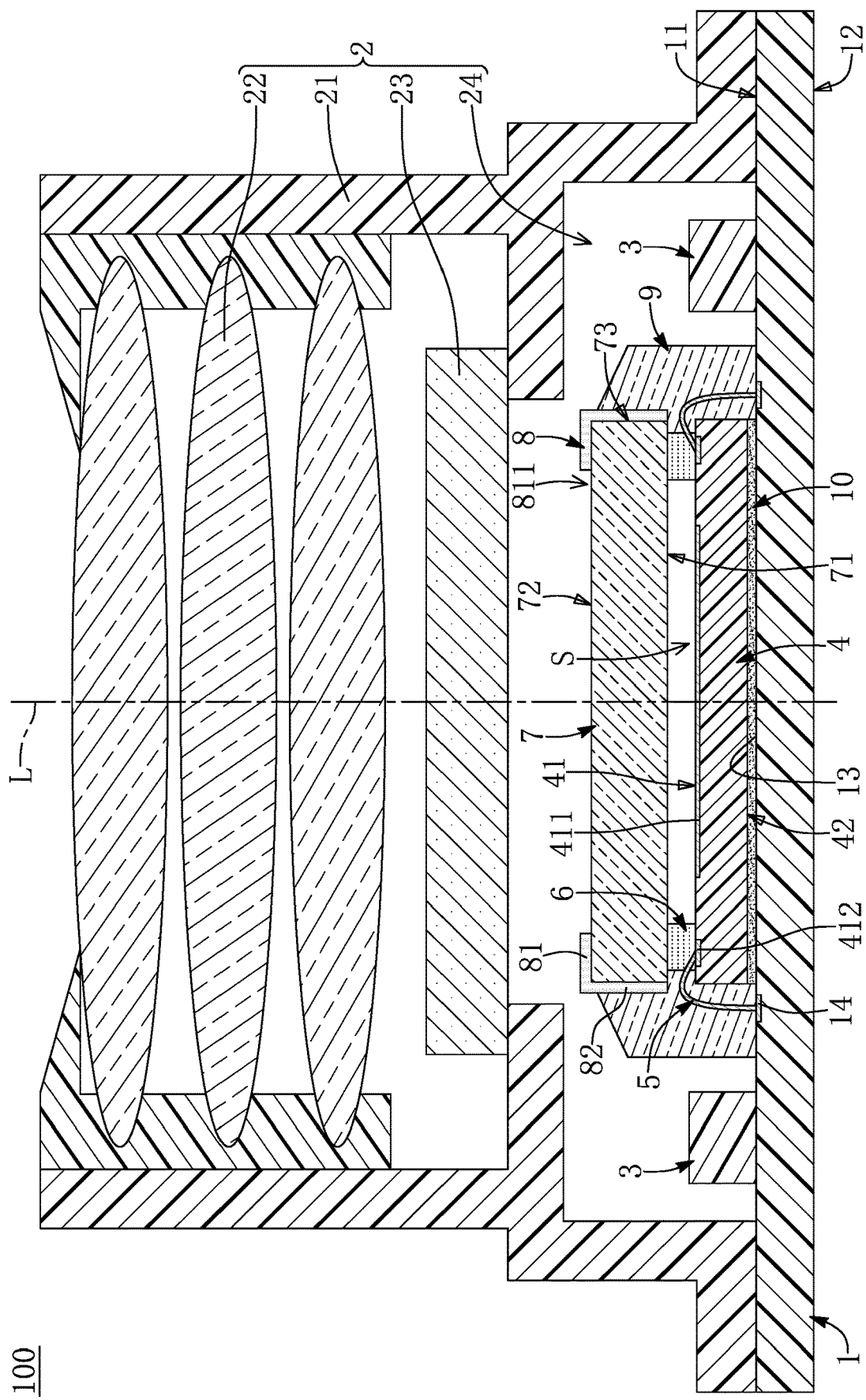
FIG. 4 is a cross-sectional view taken along line IV-IV of FIG. 1.
Figure 5:
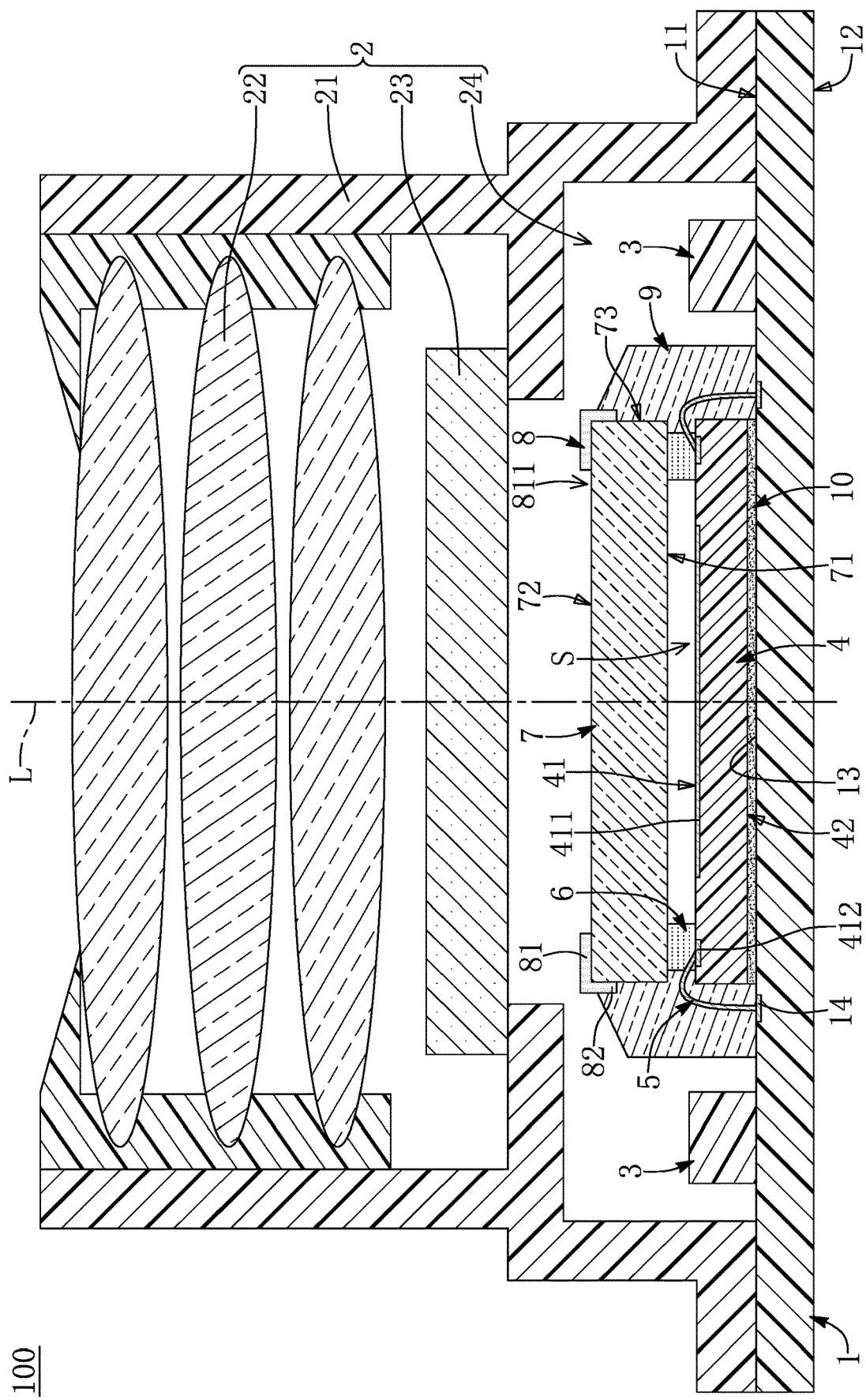
FIG. 5 is a cross-sectional view showing the sensor lens assembly of FIG. 4 in another configuration.

As shown in FIG. 3 and FIG. 4, the sensor lens assembly 100 includes a circuit board 1, an optical module 2 fixed to the circuit board 1, at least one passive electronic component 3 assembled to the circuit board 1, a sensor chip 4 assembled to the circuit board 1, a plurality of wires 5 electrically coupling the sensor chip 4 and the circuit board 1, a supporting adhesive layer 6 disposed on the sensor chip 4, a light-permeable sheet 7 disposed on the supporting adhesive layer 6, a shielding layer 8 formed on the light-permeable sheet 7, and a sealing compound 9.

The sensor lens assembly 100 in the present embodiment is described by including the above components, but the sensor lens assembly 100 can be adjusted or changed according to design requirements. For example, in other embodiments of the present disclosure not shown in the drawings, the sensor lens assembly 100 can be provided by omitting the at least one passive electronic component 3 and/or the sealing compound 9.

The circuit board 1 in the present embodiment can be a printed circuit board (PCB) or a flexible printed circuit (FPC), but the present disclosure is not limited thereto. The circuit board 1 has a first surface 11 and a second surface 12 that is opposite to the first surface 11. The circuit board 1 has no slot recessed in the first surface 11, and the circuit board 1 includes a chip-bonding region 13 arranged on the first surface 11 and a plurality of bonding pads 14 that are arranged on the first surface 11 and outside of the chip-bonding region 13.

In addition, as shown in FIG. 1 and FIG. 2, the circuit board 1 can be provided with an electrical connector 15. The circuit board 1 is configured to be detachably connected to an electronic device (not shown in the drawings) through the electrical connector 15, so that the sensor lens assembly 100 can be assembled and electrically connected to the electronic device.

As shown in FIG. 3 and FIG. 4, the optical module 2 includes a frame 21, at least one lens 22 assembled into the frame 21, and a filtering sheet 23 assembled into the frame 21. A bottom of the frame 21 is fixed to the first surface 11 of the circuit board 1, a central axis L of the at least one lens 22 passes through the chip-bonding region 13, and the filtering sheet 23 is positioned along the central axis L. The at least one passive electronic component 3 is assembled to the first surface 11 of the circuit board 1 and is arranged adjacent to the frame 21. Moreover, a quantity of the at least one passive electronic component 3 can be adjusted or changed according to design requirements, and outer lateral edges of the circuit board 1 can be partially flush with the frame 21 (e.g., three of the outer lateral edges of the circuit board 1 are flush with the frame 21), but the present disclosure is not limited thereto.

Specifically, a quantity of the at least one lens 22 in the present embodiment is more than one, and the central axes L of the multiple ones of the lens 22 are overlapped with each other, and the filtering sheet 23 is located between the lenses 22 and the chip-bonding region 13. The frame 21, the filtering sheet 23, and the first surface 11 of the circuit board 1 jointly define a distribution space 24. Moreover, the chip-bonding region 13, the bonding pads 14, the at least one passive electronic component 3, the sensor chip 4, the wires 5, the supporting adhesive layer 6, the light-permeable sheet 7, the shielding layer 8, and the sealing compound 9 are arranged in the distribution space 24.

The sensor chip 4 in the present embodiment is an image sensor chip, but the present disclosure is not limited thereto. The sensor chip 4 is disposed on the chip-bonding region 13 of the circuit board 1 (e.g., a bottom surface 42 of the sensor chip 4 faces the chip-bonding region 13), and is positioned along the central axis L.

It should be noted that the sensor lens assembly 100 in the present embodiment includes an adhesive 10 (e.g., a thermally conductive adhesive) disposed on the chip-bonding region 13, and the sensor chip 4 is fixed to the chip-bonding region 13 through the adhesive 10 (e.g., the bottom surface 42 of the sensor chip 4 is adhered to the chip-bonding region 13 through the adhesive 10), but the present disclosure is not limited thereto. For example, in other embodiments of the present disclosure not shown in the drawings, the adhesive 10 can be omitted or can be replaced by other components.

Moreover, the sensor chip 4 includes a sensing region 411 arranged on the top surface 41 and a plurality of connection pads 412 that are arranged on the top surface 41 and outside of the sensing region 411. The filtering sheet 23 is chosen according to (or corresponding to) the sensing region 411 of the sensor chip 4. For example, when light passes through the at least one lens 22, the filtering sheet 23 is configured to (only) allow a wavelength band of the light corresponding to the sensing region 411 to pass therethrough.

In the present embodiment, the bonding pads 14 are in a ring-shaped arrangement, the connection pads 412 arranged on the top surface 41 surround the sensing region 411 in a substantially ring-shaped arrangement, and the connection pads 412 preferably correspond in position to the bonding pads 14, respectively, but the present disclosure is not limited thereto. For example, in other embodiments of the present disclosure not shown in the drawings, the connection pads 412 can be arranged in two rows that are respectively located at two opposite sides of the sensing region 411, the bonding pads 14 can also be arranged in two rows that are respectively located at two opposite sides of the chip-bonding region 13, and the connection pads 412 respectively correspond in position to the bonding pads 14.

The wires 5 electrically couple the bonding pads 14 to the connection pads 412, respectively. In other words, each of the wires 5 is formed in a wiring manner, so that two opposite ends of each of the wires 5 are respectively connected to one of the bonding pads 14 and the corresponding connection pad 412.

Moreover, the supporting adhesive layer 6 is in a ringed shape and is disposed on the top surface 41 of the sensor chip 4. The supporting adhesive layer 6 surrounds or is arranged outside of the sensing region 411, and each of the connection pads 412 and a part of the corresponding wire 5 connected thereto are embedded in the supporting adhesive layer 6, but the present disclosure is not limited thereto.

The light-permeable sheet 7 has an inner surface 71, an outer surface 72, and a surrounding lateral surface 73 that is connected to the inner surface 71 and the outer surface 72. The inner surface 71 of the light-permeable sheet 7 is disposed on the supporting adhesive layer 6 and faces the sensing region 411 of the sensor chip 4 (i.e., the supporting adhesive layer 6 is sandwiched between the top surface 41 of the sensor chip 4 and the inner surface 71 of the light-permeable sheet 7), so that the light-permeable sheet 7, the supporting adhesive layer 6, and the top surface 41 of the sensor chip 4 jointly define an enclosed space S. The sensing region 411 is arranged in the enclosed space S and faces the light-permeable sheet 7.

In addition, since the sealing compound 9 in the present embodiment is light-permeable, the shielding layer 8 is formed on the outer surface 72 and the surrounding lateral surface 73 of the light-permeable sheet 7. Specifically, the shielding layer 8 includes a top shielding layer 81 and the lateral shielding layer 82. The top shielding layer 81 is formed on the outer surface 72 of the light-permeable sheet 7, and the top shielding layer 81 is in a ringed shape and has an opening 811 arranged above the sensing region 411.

Moreover, the lateral shielding layer 82 is formed on and occupies at least 30% of an area of the surrounding lateral surface 72 of the light-permeable sheet 7 (shown in FIG. 4 to FIG. 6), so that a flare phenomenon of the sensor chip 4, which is caused from an external light passing through the light-permeable sheet 7, can be effectively avoided. The distribution manner of the lateral shielding layer 82 formed on the surrounding lateral surface 73 can be adjusted or changed according to design requirements.

Figure 6:
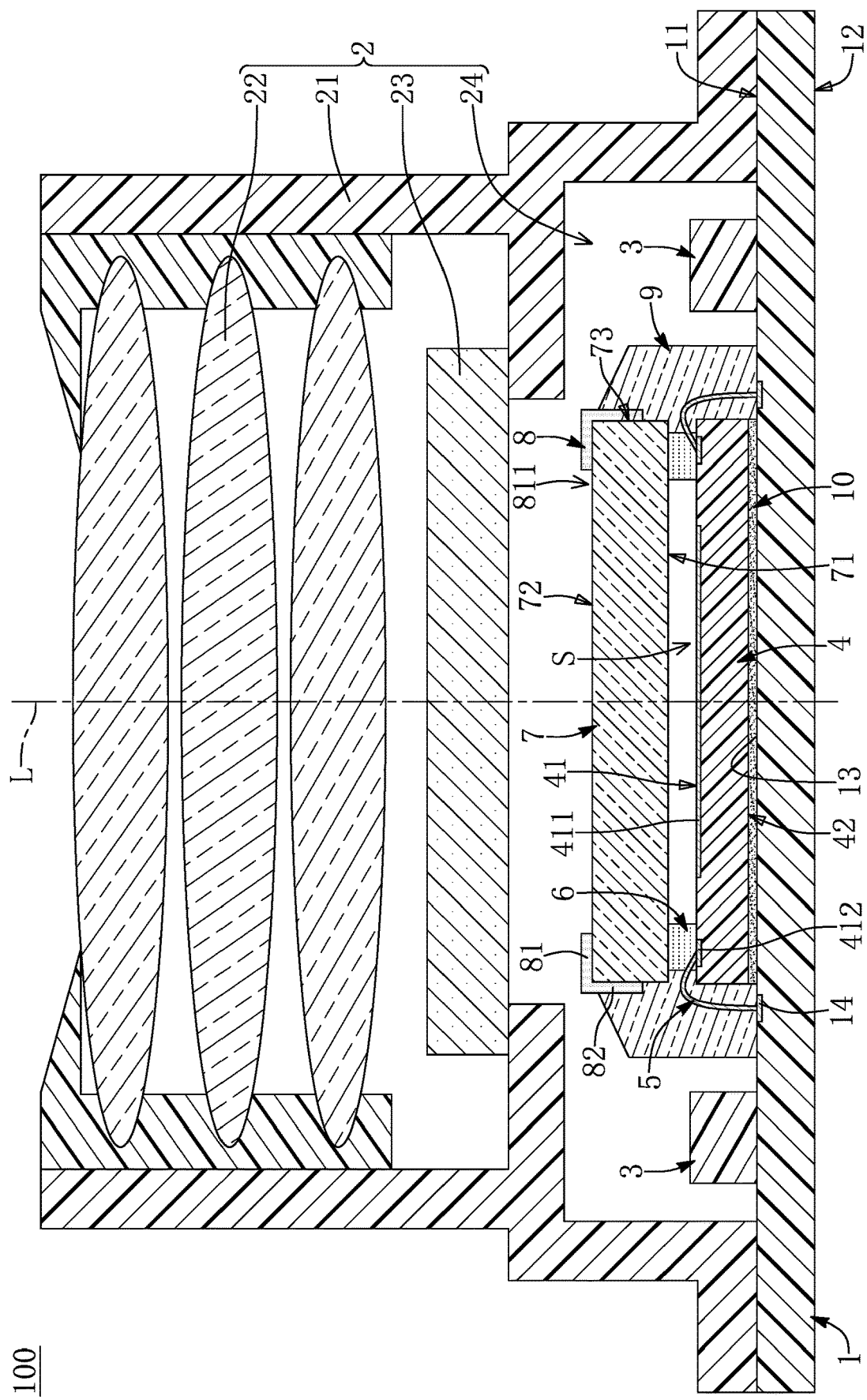
FIG. 6 is a cross-sectional view showing the sensor lens assembly of FIG. 4 in yet another configuration.

For example, as shown in FIG. 4, the lateral shielding layer 82 is in a ringed shape and is connected to an outer edge of the top shielding layer 81, and the lateral shielding layer 82 is formed on entire area of the surrounding lateral surface 73 of the light-permeable sheet 7; or, as shown in FIG. 6, the lateral shielding layer 82 is in a ringed shape and is connected to the outer edge of the top shielding layer 81, and the lateral shielding layer 82 is formed on and occupies at least 70% of the area of the surrounding lateral surface 73 of the light-permeable sheet 7, but the present disclosure is not limited thereto. For example, in other embodiments of the present disclosure not shown in the drawings, the lateral shielding layer 82 can be not connected to the outer edge of the top shielding layer 81 (i.e., the lateral shielding layer 82 is spaced apart from the top shielding layer 81).

Figure 7:
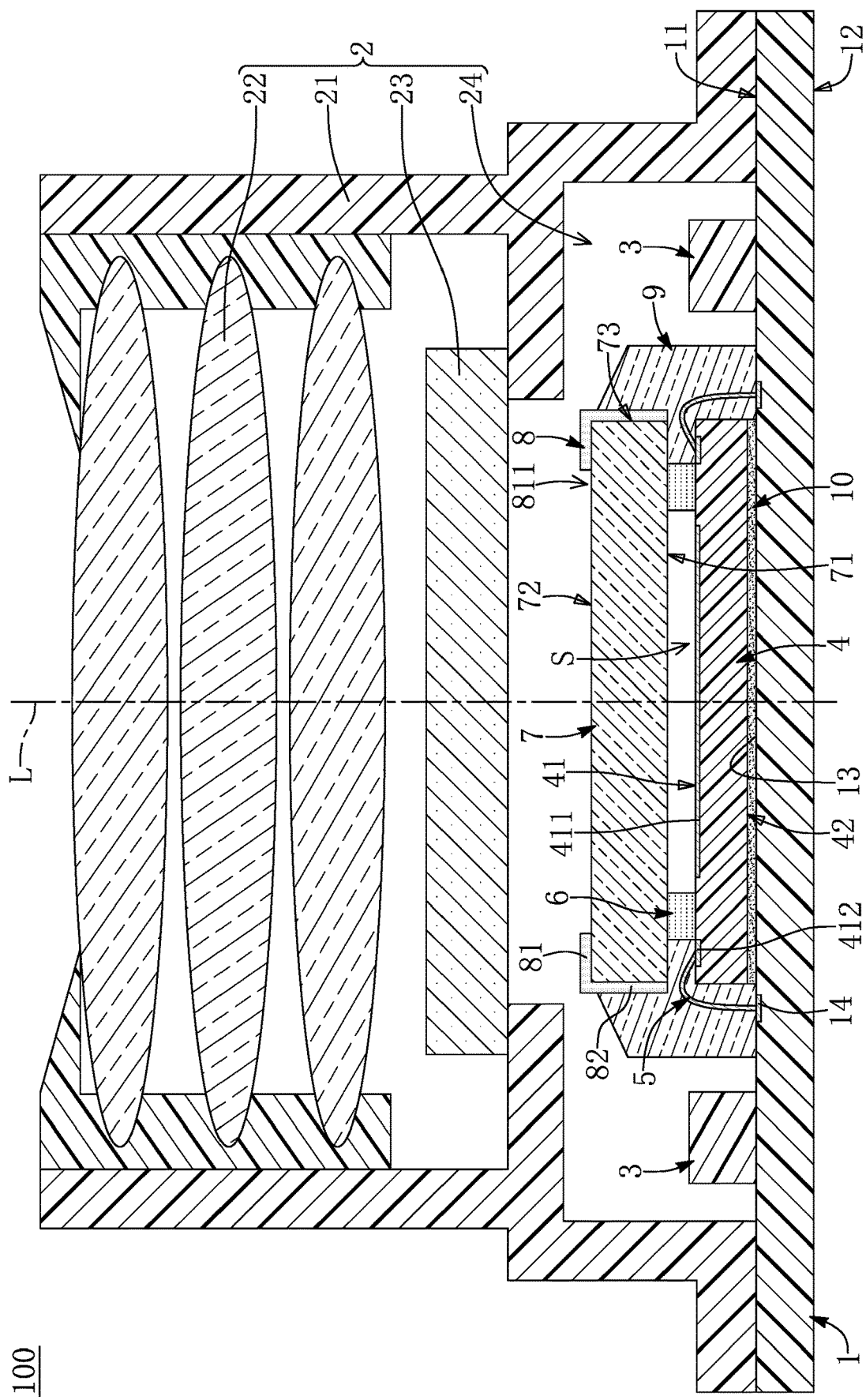
FIG. 7 is a cross-sectional view showing the sensor lens assembly of FIG. 4 in still yet another configuration.

As shown in FIG. 3 and FIG. 4, the sealing compound 9 is formed on the first surface 11 of the circuit board 1. The sealing compound 9 surrounds the sensor chip 4, the supporting adhesive layer 6, the surrounding lateral surface 73 of the light-permeable sheet 7, and the lateral shielding layer 82, and the connection pads 14 and at least part of each of the wires 5 are embedded in the sealing compound 9, but the present disclosure is not limited thereto. For example, as shown in FIG. 7, the connection pads 412 are arranged outside of the supporting adhesive layer 6, so that the connection pads 412, and the wires 5 are embedded in the sealing compound 9.

In summary, through cooperation of the above components, the sensor lens assembly 100 provided by the present embodiment does not need to go through any reflow process through the non-reflow configuration thereof, such as to allow that the component relationships arranged in the distribution space 24 (e.g., connection between any two of the sensor chip 4, the wires 5, the supporting adhesive layer 6, the light-permeable sheet 7, and the sealing compound 9) just need to satisfy a lower level of high-temperature resistance requirement. Accordingly, a material cost of the sensor lens assembly 100 can be decreased, and the product yield of the sensor lens assembly 100 can be increased.

Specifically, since the sensor lens assembly 100 of the present embodiment does not need to go through a reflow process, the sensor lens assembly 100 does not need to be subjected to relevant testing processes, thereby effectively simplifying the entire production process to improve the production efficiency of the sensor lens assembly 100.

Second Embodiment

Figure 8:
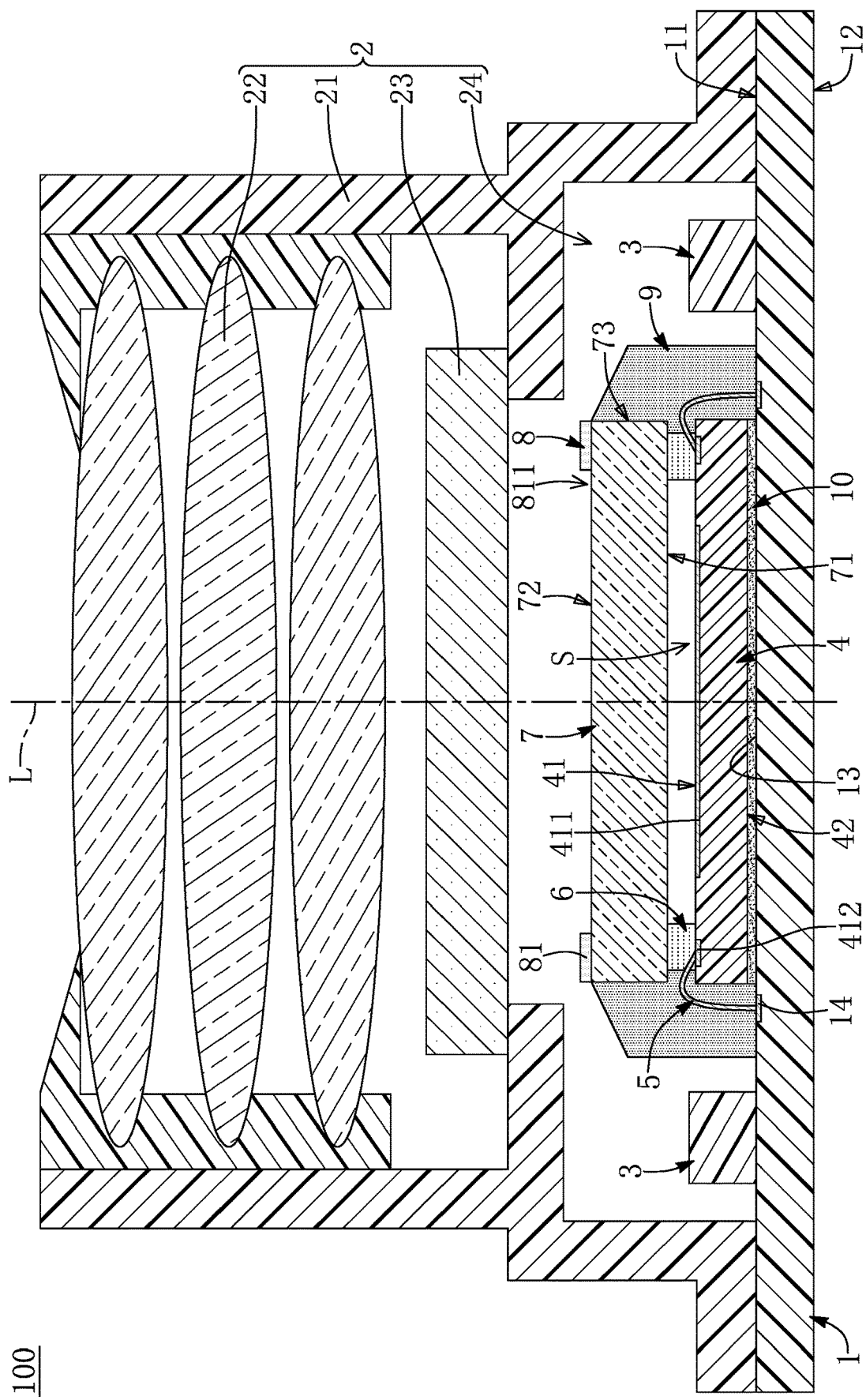
FIG. 8 is a cross-sectional view of the sensor lens assembly having a non-reflow configuration according to a second embodiment of the present disclosure.
Figure 9:
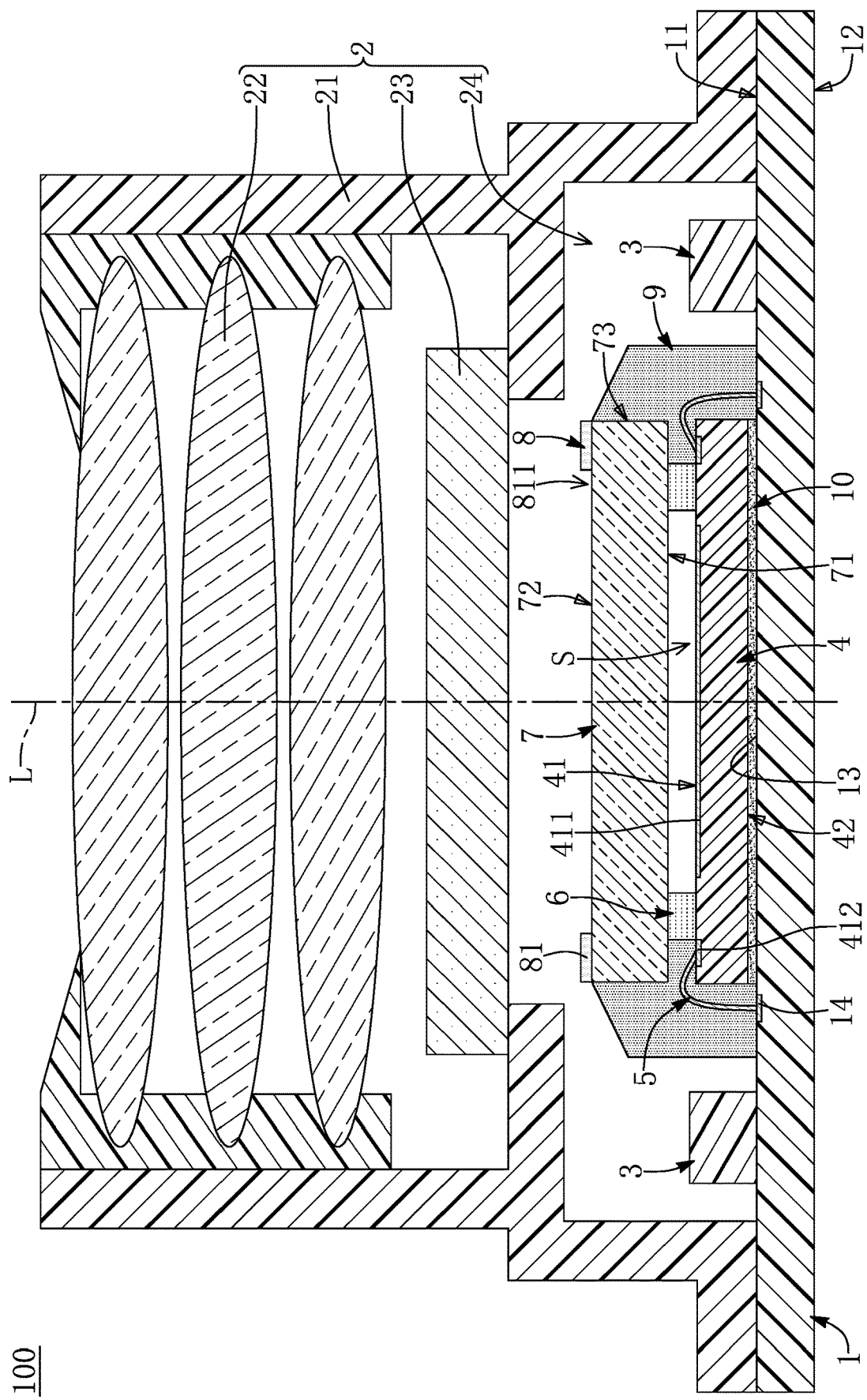
FIG. 9 is a cross-sectional view showing the sensor lens assembly of FIG. 8 in another configuration.

Referring to FIG. 8 and FIG. 9, a second embodiment of the present disclosure is provided, which is similar to the first embodiment of the present disclosure. For the sake of brevity, descriptions of the same components in the first and second embodiments of the present disclosure (e.g., the circuit board 1, the optical module 2, and the passive electronic component 3) will be omitted herein. Different features between the first and second embodiments reside in the sealing compound 9 and the shielding layer 8, and the following description only discloses the different features.

In the present embodiment, the sealing compound 9 is opaque and surrounds the sensor chip 4, the supporting adhesive layer 6, and the surrounding lateral surface 73 of the light-permeable sheet 7. The shielding layer 8 in the present embodiment does not have the lateral shielding layer 82 described in the first embodiment (i.e., the shielding layer 8 in the present embodiment only has the top shielding layer 81). Moreover, the sealing compound 9 is connected to the outer edge of the top shielding layer 81, so as to make it impossible for external light to pass through the surrounding lateral surface 73 of the light-permeable sheet 7, thereby effectively preventing the flare phenomenon from occurring to the sensor chip 4.

In addition, as shown in FIG. 9, the wires 5, the bonding pads 14, and the connection pads 412 in the present embodiment can be embedded in the opaque sealing compound 9, thereby effectively preventing the flare phenomenon from occurring to the sensing region 411 of the sensor chip 4 due to the above components.

Beneficial Effects of the Embodiments

In conclusion, through cooperation of the above components, the sensor lens assembly provided by the present disclosure does not need to go through any reflow process through the non-reflow configuration thereof, such as to allow that the component relationships arranged in the distribution space (e.g., connection between any two of the sensor chip, the wires, the supporting adhesive layer, the light-permeable sheet, and the sealing compound) just need to satisfy a lower level of high-temperature resistance requirement. Accordingly, material cost of the sensor lens assembly can be decreased, and the product yield of the sensor lens assembly can be increased.

Specifically, since the sensor lens assembly of the present disclosure does not need to go through a reflow process, the sensor lens assembly does not need to be subjected to relevant testing processes, thereby effectively simplifying the entire production process to improve the production efficiency of the sensor lens assembly.

In addition, the sensor lens assembly of the present disclosure is provided with the top shielding layer that is in cooperation with the lateral shielding layer or the opaque sealing compound, so as to make it difficult for external light to pass through the surrounding lateral surface of the light-permeable sheet, thereby effectively preventing the flare phenomenon from occurring to the sensor chip.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor lens assembly having a non-reflow configuration, comprising:
    a circuit board having a first surface and a second surface that is opposite to the first surface, wherein the circuit board has no slot recessed in the first surface, and the first surface of the circuit board includes a chip-bonding region and a plurality of bonding pads that are arranged outside of the chip-bonding region;
    an optical module including:
        a frame fixed on the first surface of the circuit board;
        at least one lens assembled into the frame, wherein a central axis of the at least one lens passes through the chip-bonding region; and
        a filtering sheet assembled into the frame and positioned along the central axis, wherein the frame, the filtering sheet, and the first surface jointly define a distribution space, and the chip-bonding region and the bonding pads are arranged in the distribution space;
    a sensor chip including a sensing region arranged on a top surface thereof and a plurality of connection pads arranged on the top surface and outside of the sensing region, wherein the sensor chip is disposed on the chip-bonding region, and the sensing region is located at the central axis;
    a plurality of wires, wherein the bonding pads are respectively and electrically coupled to the connection pads through the wires;

a supporting adhesive layer being in a ringed shape, wherein the supporting adhesive layer is disposed on the top surface of the sensor chip and outside of the sensing region;

a light-permeable sheet having an inner surface, an outer surface, and a surrounding lateral surface that is connected to the inner surface and the outer surface, wherein the inner surface of the light-permeable sheet is disposed on the supporting adhesive layer and faces the sensor chip, so that the light-permeable sheet, the supporting adhesive layer, and the top surface of the sensor chip jointly define an enclosed space;

a top shielding layer formed on the outer surface of the light-permeable sheet, wherein the top shielding layer is in a ringed shape and has an opening formed above the sensing region; and a lateral shielding layer formed on and occupying at least 30% of an area of the surrounding lateral surface of the light-permeable sheet.

2. The sensor lens assembly according to claim 1, wherein the lateral shielding layer is in a ringed shape and is connected to an outer edge of the top shielding layer.

3. The sensor lens assembly according to claim 2, further comprising a sealing compound formed on the first surface, wherein the sealing compound surrounds the sensor chip, the supporting adhesive layer, the surrounding lateral surface of the light-permeable sheet, and the lateral shielding layer, and the connection pads and at least part of each of the wires are embedded in the sealing compound.

4. The sensor lens assembly according to claim 3, wherein the sealing compound is light-permeable, and the lateral shielding layer is formed on and occupies at least 70% of the area of the surrounding lateral surface of the light-permeable sheet.

5. The sensor lens assembly according to claim 3, wherein the sealing compound is light-permeable, and the lateral shielding layer is formed on entire area of the surrounding lateral surface of the light-permeable sheet.

6. The sensor lens assembly according to claim 3, wherein each of the connection pads and a part of the corresponding wire connected thereto are embedded in the sealing compound.

7. The sensor lens assembly according to claim 1, wherein a bottom surface of the sensor chip is adhered to the chip-bonding region through an adhesive.

8. A sensor lens assembly having a non-reflow configuration, comprising:

a circuit board having a first surface and a second surface that is opposite to the first surface, wherein the circuit board has no slot recessed in the first surface, and the first surface of the circuit board includes a chip-bonding region and a plurality of bonding pads that are arranged outside of the chip-bonding region;

an optical module including:

a frame fixed on the first surface of the circuit board;

at least one lens assembled into the frame, wherein a central axis of the at least one lens passes through the chip-bonding region; and a filtering sheet assembled into the frame and positioned along the central axis, wherein the frame, the filtering sheet, and the first surface jointly define a distribution space, and the chip-bonding region and the bonding pads are arranged in the distribution space;

a sensor chip including a sensing region arranged on a top surface thereof and a plurality of connection pads that are arranged on the top surface and outside of the sensing region, wherein the sensor chip is disposed on the chip-bonding region, and the sensing region is located at the central axis;

a plurality of wires, wherein the bonding pads are respectively and electrically coupled to the connection pads through the wires;

a supporting adhesive layer being in a ringed shape, wherein the supporting adhesive layer is disposed on the top surface of the sensor chip and outside of the sensing region;

a light-permeable sheet having an inner surface, an outer surface, and a surrounding lateral surface that is connected to the inner surface and the outer surface, wherein the inner surface of the light-permeable sheet is disposed on the supporting adhesive layer and faces the sensor chip, so that the light-permeable sheet, the supporting adhesive layer, and the top surface of the sensor chip jointly define an enclosed space;

a top shielding layer formed on the outer surface of the light-permeable sheet, wherein the top shielding layer is in a ringed shape and has an opening arranged above the sensing region; and a sealing compound being opaque and formed on the first surface of the circuit board, wherein the sealing compound surrounds the sensor chip, the supporting adhesive layer, and the surrounding lateral surface of the light-permeable sheet, and the connection pads and at least part of each of the wires are embedded in the sealing compound.

9. The sensor lens assembly according to claim 8, wherein the sealing compound is connected to an outer edge of the top shielding layer.

10. The sensor lens assembly according to claim 8, wherein, when light passes through the at least one lens, the filtering sheet is configured to allow the light of a wavelength band corresponding to the sensing region to pass therethrough, and wherein the sensor lens assembly includes at least one passive electronic component arranged in the distribution space and assembled onto the first surface of the circuit board.

* * * * *